(12) United States Patent
Shimodaira

(10) Patent No.: US 8,080,921 B2
(45) Date of Patent: Dec. 20, 2011

(54) REDUCED-HEIGHT PIEZOELECTRIC DEVICE HAVING A PIEZOELECTRIC RESONATOR AND ELECTRONIC COMPONENT

(75) Inventor: Kazuhiko Shimodaira, Minowa-machi (JP)

(73) Assignee: Epson Toyocom Corporation, Tokyo (JP)

( * ) Notice: Subject to any disclaimer, the term of this patent is extended or adjusted under 35 U.S.C. 154(b) by 359 days.

(21) Appl. No.: 12/398,663

(22) Filed: Mar. 5, 2009

(65) Prior Publication Data

US 2009/0224635 A1    Sep. 10, 2009

(30) Foreign Application Priority Data

Mar. 10, 2008    (JP) .................................. 2008-059319

(51) Int. Cl.
*H01L 41/08*    (2006.01)
(52) U.S. Cl. ....................................... 310/344; 310/348
(58) Field of Classification Search ................. 310/344, 310/348
See application file for complete search history.

(56) References Cited

U.S. PATENT DOCUMENTS

| | | | | |
|---|---|---|---|---|
| 4,282,498 A | * | 8/1981 | Iizawa | 333/186 |
| 4,750,246 A | * | 6/1988 | Pollard | 29/25.35 |
| 5,041,800 A | * | 8/1991 | Long et al. | 331/69 |
| 6,246,013 B1 | * | 6/2001 | Yoshida et al. | 174/260 |
| 6,531,807 B2 | * | 3/2003 | Tanaka et al. | 310/344 |
| 2007/0138916 A1 | * | 6/2007 | Koyama | 310/348 |
| 2009/0236936 A1 | * | 9/2009 | Tamura | 310/314 |

FOREIGN PATENT DOCUMENTS

| | | | |
|---|---|---|---|
| JP | 52067287 A | * | 6/1977 |
| JP | A-2000-31324 | | 1/2000 |
| JP | A-2007-201044 | | 8/2007 |
| JP | A-2007-214307 | | 8/2007 |
| JP | 2010119057 A | * | 5/2010 |
| JP | 2010135874 A | * | 6/2010 |
| JP | 2010183398 A | * | 8/2010 |

* cited by examiner

*Primary Examiner* — Jaydi San Martin
(74) *Attorney, Agent, or Firm* — Oliff & Berridge, PLC

(57) ABSTRACT

A piezoelectric device includes: a base substrate; an electronic component provided on a first surface of the base substrate; and a piezoelectric resonator that is provided on the first surface of the base substrate without planarly overlapping with the electronic component and have a package base, a mounting surface of the package base having one of a recessed part and a cutout part. In the device, the base substrate includes a resonator-disposing section disposed in a region of the one of the recessed part and the cutout part of the piezoelectric resonator and the resonator-disposing section is a part of the base substrate in plan view and is coupled to a bottom surface of the one of the recessed part and the cutout part.

4 Claims, 4 Drawing Sheets

REDUCED-HEIGHT PIEZOELECTRIC DEVICE HAVING A PIEZOELECTRIC RESONATOR AND ELECTRONIC COMPONENT

BACKGROUND

1. Technical Field

The present invention relates to a piezoelectric device, in particular to a piezoelectric device having a piezoelectric resonator and an electronic component on a substrate.

2. Related Art

Piezoelectric devices having a piezoelectric resonator and an electronic component on a substrate are widely used in electronic equipment such as small sized information equipment. Recently, the size of the electronic equipment is increasingly reduced in height, and the piezoelectric device used in the electronic equipment is also required to have a lower height. JP-A-2000-31324 and JP-A-2007-201044 disclose examples of such a piezoelectric device having a reduced height. Disclosed in these documents is a piezoelectric device in which a quartz crystal resonator and an integrated circuit (IC) chip mounted on a substrate are molded with a sealant such as resin.

FIGS. 4A and 4B are diagrams schematically showing the structure of a related-art piezoelectric device. FIG. 4A is a side surface diagram, and FIG. 4B is a partially enlarged diagram of the device. Referring to the drawings, a piezoelectric device 1 includes a piezoelectric resonator 3 and an electronic component (IC chip) 4 mounted on the upper surface of a base substrate 2. A piezoelectric resonator element 5 is mounted in an internal space between a lid 9 and a package base 6. The package base 6 includes, from the lower layer, a flat plate substrate 7 and a frame-shaped substrate 9, in this order. When mounting the piezoelectric resonator 3 on the base substrate 2, an external electrode provided on the mounting surface of the flat plate substrate of the package base 6 is electrically coupled to a mounting electrode provided on the mounting surface of the base substrate 2.

In the piezoelectric device of the related art, however, because a component such as the piezoelectric resonator is mounted on the base substrate, the sum of the thickness of the package base of the piezoelectric resonator and the thickness of the base substrate becomes a total thickness d of the entire product, with reference to FIG. 4B. Therefore, even if a flat plate substrate constituting the package base is made thin, the height of the piezoelectric device is increased after all, because the sum of the thickness of the package base of the piezoelectric resonator and the thickness of the base substrate becomes the total thickness of the piezoelectric device. Accordingly, the reduction of height of the piezoelectric device has not been achieved.

SUMMARY

An advantage of the invention is to provide a reduced-height piezoelectric device having a piezoelectric resonator and an electronic component mounted on a base substrate.

According to the invention, a piezoelectric device includes: an electronic component provided on a first surface of the base substrate; and a piezoelectric resonator that is provided on the first surface of the base substrate without planarly overlapping with the electronic component and have a package base, a mounting surface of the package base having a recessed part or a cutout part. In the device, the base substrate includes a resonator-disposing section disposed in one of the recessed part or the cutout part of the piezoelectric resonator and the resonator-disposing section is a part of the base substrate and is coupled to a bottom surface of the recessed part or the cutout part.

In this case, because a part of the base substrate is set in a part of the package base, the height of the entire device may be reduced. Also, because the base substrate is set in the recessed part or the cutout part provided to the package of the piezoelectric resonator, it is possible to readily conduct positioning at the time of mounting and to prevent displacement of mounting positions.

It is preferable that the piezoelectric device further include: an external electrode provided on the bottom surface of the recessed part or the cutout part of the package base, and a terminal provided to the resonator-disposing section of the base substrate and joined to the external electrode with a joining member.

In this case, it is not necessary to provide the external electrode on the lowest surface of the package base. Thus, even if the package base has a structure such that a part of the base substrate is set in a part of the package base, that is, that the lowermost surface of the package base and the base substrate do not come in contact with each other, it is possible to electrically couple the piezoelectric resonator to the base substrate. Accordingly, the height of the piezoelectric device may be reduced.

It is preferable that the piezoelectric device be such that: the package base includes: a first substrate disposed as an uppermost layer and having an opening housing a piezoelectric resonator element, a second substrate disposed as an intermediate layer and sealing the opening, and a third substrate disposed as a lowermost layer; the base substrate includes the resonator-disposing section having a planarly projected shape; the third substrate is formed so as to sandwich the resonator-disposing section of the base substrate in plan view so that the recessed part is formed to the package base; and the resonator-disposing section of the base substrate is set in the recessed part of the package base.

In this case, the strength of the package base is increased by forming the flat plate substrate of the package base into a two-layered structure, and the height of the entire device may be reduced because the thickness of the base substrate is partially overlapped with the thickness of the flat plate substrate of the package base. Also, because the recessed part of the piezoelectric resonator is set in the projected resonator-disposing section of the base substrate, it is possible to readily conduct the positioning at the time of mounting and to prevent displacement of mounting positions.

It is preferable that the piezoelectric device be such that: the package base includes: a fourth substrate having an opening housing a piezoelectric resonator element, and a fifth substrate sealing the opening; the base substrate includes a pair of the resonator-disposing sections positioned apart from each other; the fourth substrate planarly overlaps with both of the pair of the resonator-disposing sections; the fifth substrate is provided in a region that is sandwiched between the pair of the resonator-disposing sections of the base substrate, so as to provide a pair of the cutout parts to the package base; and each of the pair of resonator-disposing sections of the base substrate is set in one of the pair of cutout parts of the package base.

In this case, it is possible to reduce the thickness of the flat plate substrate constituting the package base by one layer. Thus, the height of the entire piezoelectric device may be reduced. Also, because each of the pair of the resonator-disposing sections of the base substrate is set in one of the pair of the cutout parts provided to the package of the piezoelectric resonator, it is possible to readily conduct the positioning at the time of mounting and to prevent displacement of mounting positions.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described in detail with reference to the drawings.

Figure 1A:
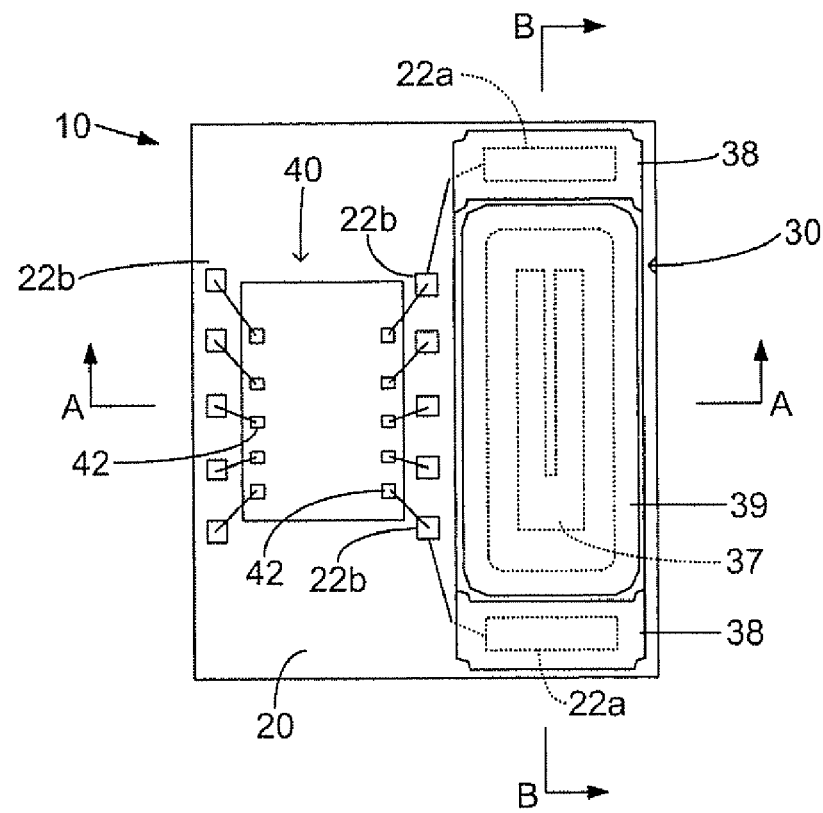
FIGS. 1A through 1C are diagrams to explain a piezoelectric oscillator of a first embodiment.
Figure 1B:
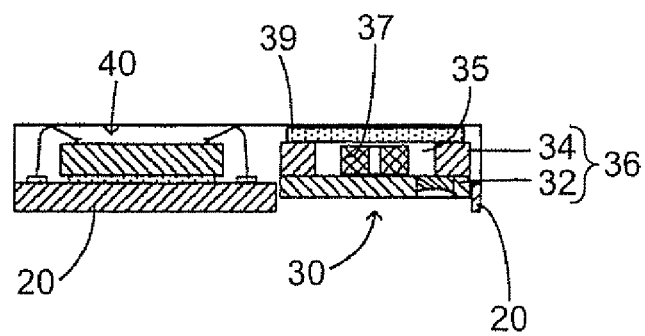
Figure 1C:
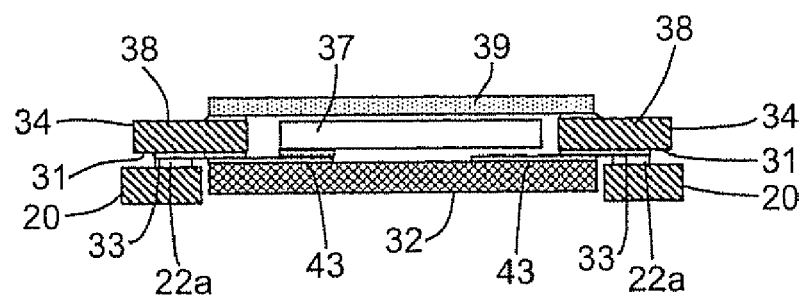
Figure 2A:
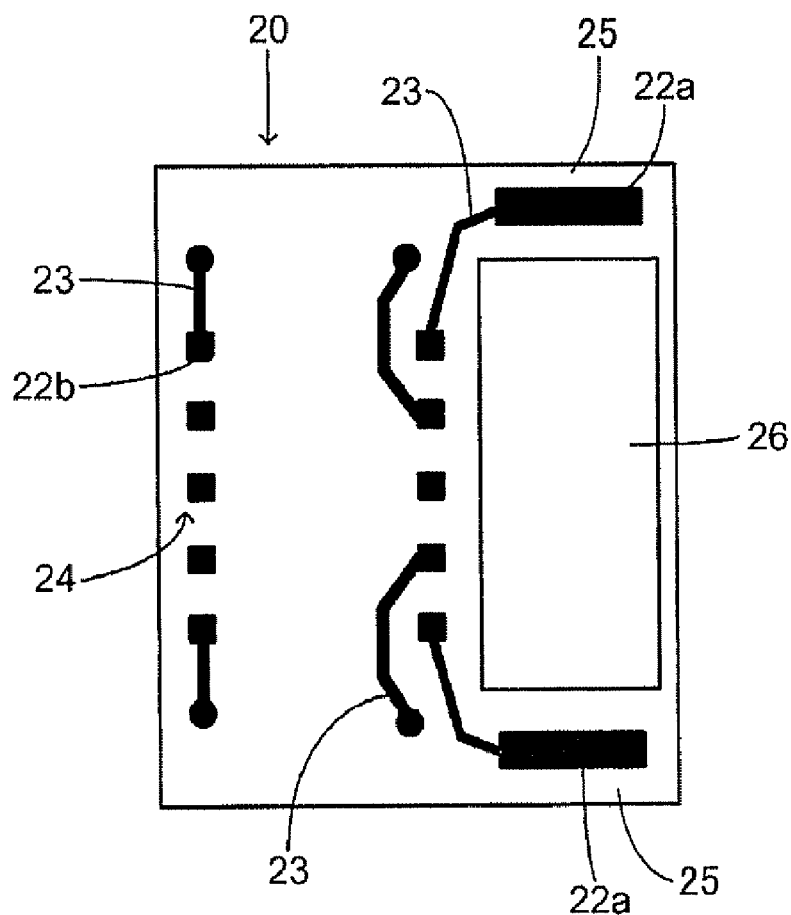
FIGS. 2A and 2B are diagrams to explain a base substrate of the piezoelectric oscillator of the first embodiment.
Figure 2B:
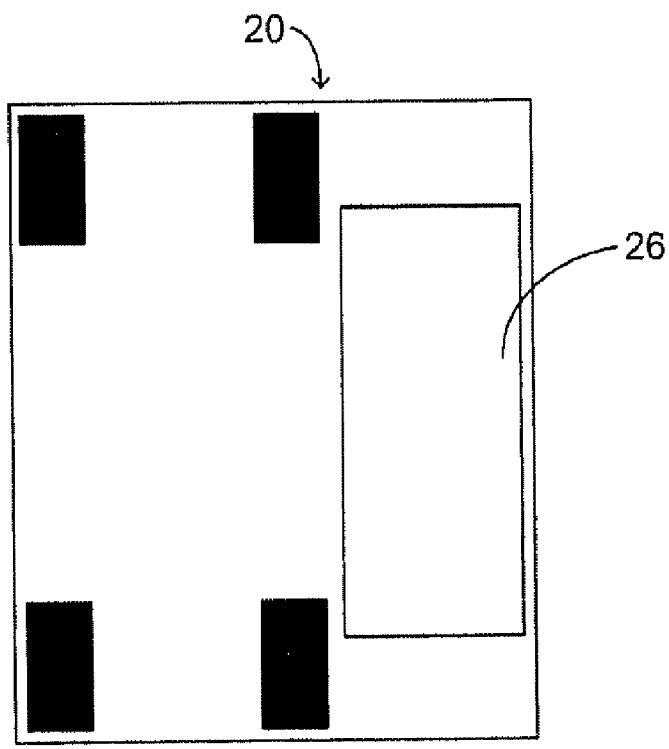

Described herein is a piezoelectric oscillator used as an example of the piezoelectric device of the embodiments of the invention. FIGS. 1A through 1C are diagrams to explain the piezoelectric oscillator of the first embodiment. FIG. 1A is a plan view of the piezoelectric oscillator. FIGS. 1B and 1C are sectional diagrams taken on lines A-A and B-B of FIG. 1A, respectively. FIGS. 2A and 2B are diagrams to explain a base substrate of the piezoelectric oscillator of the first embodiment. FIG. 2A shows the upper surface, and FIG. 2B shows the lower surface of the oscillator.

Referring to FIGS. 1A to 1C, a piezoelectric oscillator 10 of the embodiments of the invention includes a piezoelectric resonator 30 and an electronic component 40 mounted on one surface of a base substrate 20 in a manner that the resonator 30 and the component 40 do not planarly overlap with each other.

With reference to FIGS. 1B and 1C, the piezoelectric resonator 30 is a surface mount type resonator having a rectangular package base 36. The package base 36 includes an internal space 35 made by joining a frame-shaped substrate 34 having an opening and a flat plate substrate 32 closing up the opening. An electrode section 43 made, for example, by plating a tungsten-metallized surface with nickel and gold is provided on the inner bottom surface exposed to the internal space of the package base 36, that is, provided on the upper surface of the flat plate substrate 32. A piezoelectric resonator element 37 made of a piezoelectric material such as quartz crystal is joined and fixed to the upper surface of the electrode section 43 using a conductive adhesive agent.

In the first embodiment, the frame-shaped substrate 34 is made planarly larger than the flat plate substrate 32. Specifically, with reference to FIG. 1C, the long side of the frame-shaped substrate 34 is set longer than that of the flat plate substrate 32, and each support 38 projecting from the side surface of each short side of the flat plate substrate 32 is provided to a pair of short sides of the flat plate substrate 32. As a consequence, the flat plate substrate 32 and the frame-shaped substrate 34 together form sectionally cutout parts 31 on a mounting surface of the package base 36. Also, an external electrode 33 is provided to the bottom surface of each cutout part 31.

The electrode section 43 in the internal space 35 is electrically coupled to the external electrode 33 at the bottom surface of each cutout part 31. Specifically, a wire extending from the electrode section 43 is joined to a wire extending from each external electrode 33 at an area where the flat plate substrate 32 overlaps with the frame-shaped substrate 34. This allows simple electrical wiring with no need to provide through holes in the flat plate substrate 32. A lid 39 is joined to an open end-surface of the package base 36, thereby hermetically sealing the internal space 35. The lid 39 may be made thin using a metallic or glass material.

The electronic component 40 in this embodiment is an oscillation circuit element composed at least of e.g. a semiconductor element having a circuitry structure for oscillating the piezoelectric resonator 30 and has a plurality of electrical pads 42 on its upper surface, with reference to FIGS. 1A to 1C. The number and types of the electrical pads 42 of the oscillation circuit element may be set arbitrarily and modifiably. In this embodiment, examples of the electrical pads 42 may be: G/D (gate/drain) terminals electrically coupled to the piezoelectric resonator 30, input/output terminals of the oscillation circuit joined to mounting terminals, control terminals for writing data in the oscillation circuit, and ground terminals.

If an IC chip, for example, is used as the oscillation circuit element, it is possible to thinly make the IC chip. Thus, the IC chip is mounted next to the piezoelectric resonator 30 on the upper surface of the base substrate 20. Also, the IC chip is made slightly smaller than the piezoelectric resonator 30 in the horizontal direction and lower in height than the piezoelectric resonator 30 in the vertical direction. The IC chip is joined to the base substrate 20 using an adhesive agent.

The IC chip is electrically coupled to terminals 22 on the base substrate 20 by wire bonding. Thus, the IC chip in this embodiment is wire-bonded to the base substrate 20 with the adhesive agent and electrically coupled to the terminals 22. Alternatively, the IC chip may be electrically and mechanically coupled to the terminals of the substrate by flip-chip bonding.

The base substrate 20 is a member that is electrically and mechanically coupled to the piezoelectric resonator 30 and the electronic component 40 (the IC chip), and a rigid substrate or a flexible substrate may be used therefor. Specifically, in the embodiment, in order to reduce the height, the base substrate 20 includes: an insulating film made of e.g. polyimide or glass epoxy, a plurality of conductive patterns 24 provided on the upper surface of the insulating film, and an opening section 26.

The opening section 26 is disposed at a position corresponding to a place for mounting the piezoelectric resonator 30 on the base substrate 20. The opening section 26 is shaped in a rectangle that is slightly larger than the flat plate substrate 32 in plan view in order to set in the flat plate substrate 32.

The conductive pattern 24 is made of a conductive material such as copper foil and is provided to the base substrate 20 by such processes as etching, printing, vapor deposition, and plating.

With reference to FIGS. 2A and 2B, the conductive pattern 24 is composed of: the plurality of terminals 22 which become the pads for electrical coupling or electrical and mechanical coupling of the piezoelectric resonator to the IC chip, and wiring patterns 23 for electrical coupling of the plurality of terminals 22 to each other and/or for electrical coupling of the terminals 22 to the mounting terminals.

Terminals 22a are electrodes for the piezoelectric resonator to electrically and mechanically couple the piezoelectric resonator 30 to the base substrate 20. With reference to FIG. 1C, the terminals 22a are disposed at positions facing the external electrodes 33 provided on the bottom surface of the cutout parts 31 of the piezoelectric resonator 30 and are electrically and mechanically coupled to the external electrodes 33 with a bonding member such as solder or a conductive adhesive agent.

Terminals 22b are electrodes for the IC chip to electrically couple the IC chip and are wire-bonded to the electrode pads 42 of the IC chip on the side adjacent to the upper surface of the base substrate 20. Some of the terminals 22b are electrically coupled to the mounting terminals and ground terminals provided on the side adjacent to the lower surface of the base substrate 20 via a conductive member in the wiring patterns 23 and via holes.

In the piezoelectric oscillator having the aforementioned structure, the cutout parts 31, which are constituted of the flat plate substrate 32 and the frame-shaped substrate 34 of the package base 36 provided on the mounting surface of the package base 36 of the piezoelectric resonator 30, are set in the opening section 26 of the base substrate 20. Specifically, a pair of supports 38 is disposed at a pair of resonator-disposing sections 25 which is provided apart from each other and sandwiching the opening section 26. Thus, in plan view, a part of the base substrate 20 is positioned in a region of the cutout parts 31 of the piezoelectric resonator 30.

The external electrodes 33 provided on the bottom surface of the cutout parts 31 are then electrically coupled to the terminals 22a provided to the base substrate 20. The electronic component 40 is joined onto the base substrate 20 using an adhesive agent, and the electrode pads 42 and the terminals 22b of the base substrate 20 are electrically coupled by wire bonding. As a result, the piezoelectric device according to the first embodiment is produced.

According to such an embodiment, it is possible to reduce the thickness of the flat plate substrate 32 constituting the package base 36 by one layer by sectionally overlapping the thickness of the flat plate substrate 32 with the thickness of the base substrate 20. Thus, the height of the entire piezoelectric device is reduced. Also, because the cutout parts 31 of the piezoelectric resonator 30 are set in the opening section 26 of the base substrate 20, it is possible to readily conduct the positioning at the time of mounting and to prevent displacement of mounting positions.

Because the external electrodes 33 are provided on the bottom surface of the cutout parts 31 of the package base 36, it is not necessary to provide the external electrodes 33 on the lowest surface of the package base 36, and the piezoelectric resonator 30 and the base substrate 20 are electrically coupled even if a part of the base substrate 20 is planarly positioned in the region of the cutout parts 31 of the piezoelectric resonator 30. It is therefore possible to reduce the height of the piezoelectric device.

In addition, an upper surface space of the supports 38 may be effectively used as a space for mounting components such as a chip component. By providing the supports 38, a large package-sealing area is secured, and reliability of the product is thereby improved.

Figure 3A:
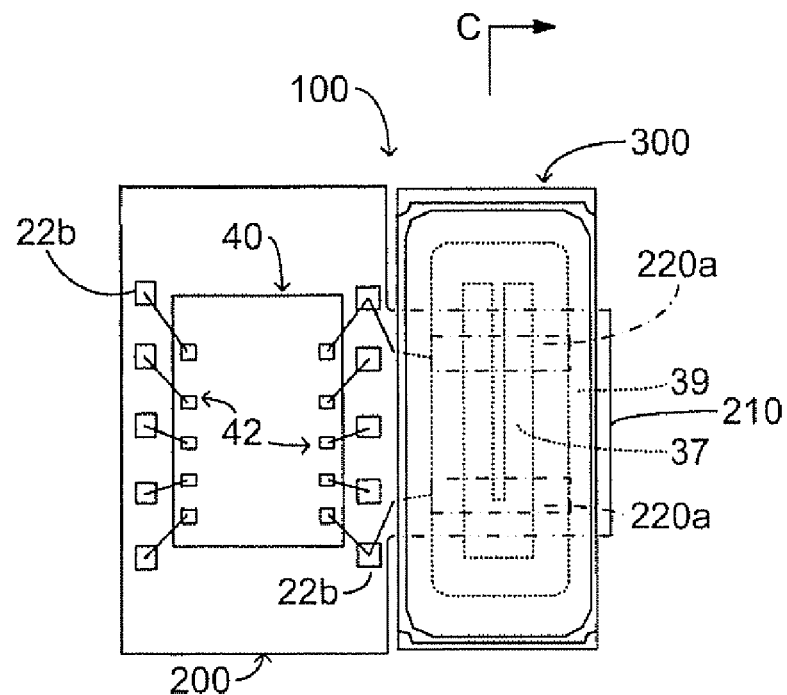
FIGS. 3A and 3B are diagrams to explain a piezoelectric oscillator of a second embodiment.
Figure 3B:
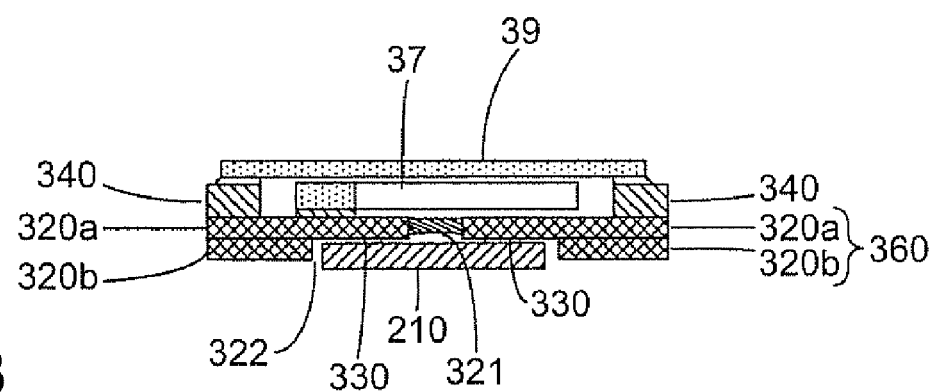
Figure 4A:
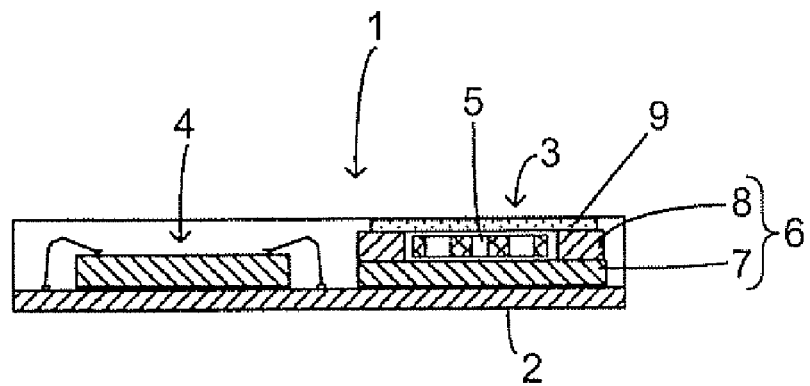
FIGS. 4A and 4B are diagrams to explain a piezoelectric device of related art.
Figure 4B:
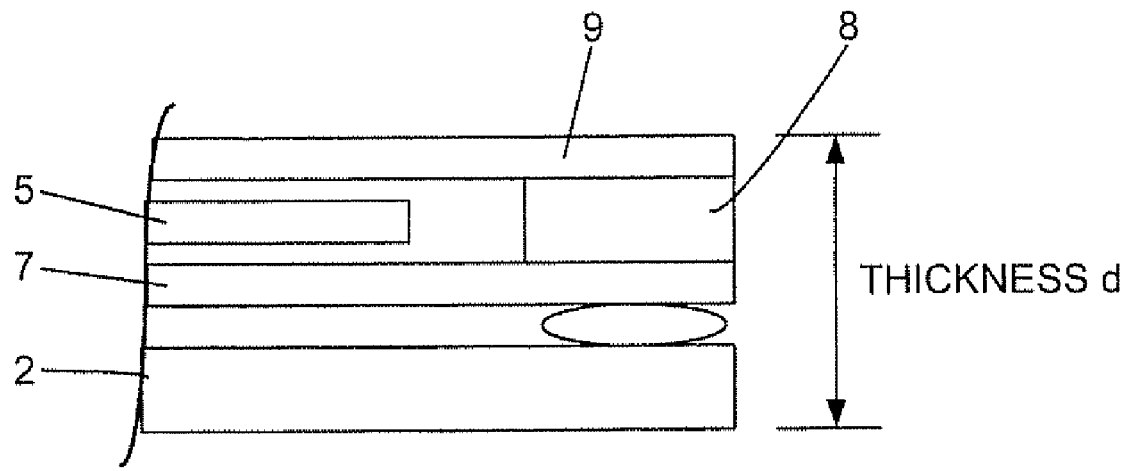

FIGS. 3A and 3B are diagrams to explain the piezoelectric oscillator of the second embodiment. FIG. 3A is a plan view of the piezoelectric device, and FIG. 3B is a sectional diagram taken on a line C-C of FIG. 3A.

As illustrated, a difference between the piezoelectric oscillator 10 of the first embodiment shown in FIGS. 1A to 1C and a piezoelectric oscillator 100 according to the second embodiment resides in the mounting structure of a piezoelectric resonator 300. Other compositions are identical to those of the piezoelectric oscillator 10 shown in FIGS. 1A to 1C, and detailed descriptions thereof will not be repeated.

With the piezoelectric oscillator 100 of the second embodiment, it is aimed to reduce the height of the entire piezoelectric device and to simultaneously increase the strength of a package base 360 of the piezoelectric resonator 300. Specifically, the package base 360 is by joining a frame-shaped substrate 340 to a flat plate substrate 320 which both have substantially an identical external configuration in plan view. Also, the flat plate substrate 320 includes a two-layered substrate (upper and lower layer substrates 320a, 320b). The upper substrate 320a includes a sealing hole 321 for sealing the package with a sealant. The lower substrate 320b includes a recessed part 322 to engage a projection 210 of a base substrate 200 which will be described hereafter.

The base substrate 200 includes the projection 210 which is a projected resonator-disposing section to engage the aforementioned recessed part 322 provided to the lower layer substrate 320b. Specifically, two corners of a planarly rectangular substrate for mounting the resonator 300 are cut out so that the rectangular substrate is formed into a substrate having a projection in plan view. Terminals 220a are provided on the mounting surface of the projection 210. Also, external electrodes 330 electrically coupled to the terminals 220a are provided on the bottom surface of the recessed part 322 of the package base 360, i.e., on the mounting surface of the upper layer substrate 320a.

In the piezoelectric oscillator 100 of the second embodiment having such a structure, the recessed part 322 provided to the mounting surface of the package base 360 of the resonator 300 engages the projection 210 of the base substrate 200, and the thickness of the flat plate substrate 320b of the lower layer sectionally overlaps with the thickness of the base substrate 200. In other words, the recessed part 322 is provided to the package base 360 in a manner that the lower layer substrate 320b of the package base 360 of the piezoelectric resonator 300 holds the projected part of the base substrate 200 in a region where the lower layer substrate 320b does not planarly overlap with the base substrate 200. Accordingly, a portion of the base substrate 200 is planarly disposed in the region of the recessed part 322 of the piezoelectric resonator 300.

Then, the external electrodes 330 provided to the recessed part 322 are electrically coupled to the terminals 220a provided to the base substrate 200. Also, the electronic component 40 is joined onto the base substrate 200 with an adhesive agent, and the electrode pads 42 and the terminals 22b of the base substrate 200 are electrically coupled to each other by wire bonding. As a result, the piezoelectric device according to the second embodiment is produced.

According to such an embodiment, the strength of the package base 360 is increased because the flat plate substrate 320 of the package base 360 has the two-layered structure, and the height of the device as a whole is reduced because part of the thickness of the flat plate substrate 320 of the package base 360 is sectionally overlapped with the thickness of the base substrate 200. Also, because the recessed part 322 of the piezoelectric resonator 300 engages the projection 210 of the base substrate 200, the positioning at the time of mounting is readily conducted, and displacement of mounting positions is prevented.

The entire disclosure of Japanese Patent Application No. 2008-059319 filed Mar. 10, 2008 is expressly incorporated by reference.

What is claimed is:

1. A piezoelectric device, comprising:
  a base substrate;
  an electronic component provided on a first surface of the base substrate; and
  a piezoelectric resonator that is provided on the first surface of the base substrate without planarly overlapping with the electronic component and has a package base, a mounting surface of the package base having one of a recessed part and a cutout part, wherein the base substrate includes a resonator-disposing section disposed in one of the recessed part and the cutout part of the piezoelectric resonator, the resonator-disposing section being a part of the base substrate and being coupled to a bottom surface of the one of the recessed part and the cutout part.

2. The piezoelectric device according to claim 1, further comprising:

an external electrode provided on the bottom surface of the one of the recessed part and the cutout part of the package base; and a terminal provided to the resonator-disposing section of the base substrate and joined to the external electrode with a joining member.

3. The piezoelectric device according to claim 1, wherein:

the package base includes:

a first substrate disposed as an uppermost layer and having an opening housing a piezoelectric resonator element;

a second substrate disposed as an intermediate layer and sealing the opening; and a third substrate disposed as a lowermost layer;

the base substrate includes the resonator-disposing section having a planarly projected shape;

the third substrate is formed so as to sandwich the resonator-disposing section of the base substrate in plan view so that the recessed part is formed to the package base; and the resonator-disposing section of the base substrate is set in the recessed part of the package base.

4. The piezoelectric device according to claim 1, wherein:

the package base includes:

a one substrate having an opening housing a piezoelectric resonator element; and an other substrate sealing the opening;

the base substrate includes a pair of the resonator-disposing sections positioned apart from each other;

the one substrate planarly overlaps with both of the pair of the resonator-disposing sections;

the other substrate is provided in a region that is sandwiched between the pair of the resonator-disposing sections of the base substrate, so as to provide a pair of the cutout parts to the package base; and each of the pair of the resonator-disposing sections of the base substrate is set one of the pair of the cutout parts of the package base.

\* \* \* \* \*

UNITED STATES PATENT AND TRADEMARK OFFICE
CERTIFICATE OF CORRECTION

PATENT NO. : 8,080,921 B2
APPLICATION NO. : 12/398663
DATED : December 20, 2011
INVENTOR(S) : Kazuhiko Shimodaira It is certified that error appears in the above-identified patent and that said Letters Patent is hereby corrected as shown below:

Please correct the Assignee information as shown below:

Replace (73) Assignee: Epson Toyocom Corporation, Tokyo (JP) with

(73) Assignee: SEIKO EPSON CORPORATION, Tokyo (JP)

Signed and Sealed this
Twelfth Day of March, 2013

Teresa Stanek Rea
*Acting Director of the United States Patent and Trademark Office*